(12) United States Patent
Ke

(10) Patent No.: US 7,392,968 B2
(45) Date of Patent: Jul. 1, 2008

(54) PEDESTAL SET

(75) Inventor: Lian Tien Ke, Taipei (TW)

(73) Assignee: ASUSTeK Computer, Inc., Taipei (TW)

( * ) Notice: Subject to any disclaimer, the term of this patent is extended or adjusted under 35 U.S.C. 154(b) by 199 days.

(21) Appl. No.: 11/218,427

(22) Filed: Sep. 6, 2005

(65) Prior Publication Data

US 2006/0081752 A1    Apr. 20, 2006

(30) Foreign Application Priority Data

Oct. 20, 2004    (TW) ................ 93131883 A

(51) Int. Cl.
*A47B 91/00*    (2006.01)
*H05K 7/00*    (2006.01)
(52) U.S. Cl. .............. 248/346.01; 248/919; 361/683
(58) Field of Classification Search ............ 248/346.01, 248/678, 221.11, 221.22, 224.8, 222.41, 248/346.03; 361/683
See application file for complete search history.

(56) References Cited

U.S. PATENT DOCUMENTS

| | | | | |
|---|---|---|---|---|
| 3,286,212 A | * | 11/1966 | Thompson et al. ...... | 248/187.1 |
| 4,635,811 A | * | 1/1987 | Lodi ...................... | 220/629 |
| 5,020,768 A | * | 6/1991 | Hardt et al. ............. | 248/678 |
| 5,388,792 A | * | 2/1995 | Hastings et al. ......... | 248/188.1 |
| 6,059,384 A | * | 5/2000 | Ho ......................... | 312/223.2 |
| 6,364,278 B1 | * | 4/2002 | Lin et al. ................ | 248/676 |
| 6,439,528 B1 | * | 8/2002 | Goto et al. ............. | 248/346.01 |
| 6,923,414 B2 | * | 8/2005 | Shida et al. ............ | 248/346.07 |

FOREIGN PATENT DOCUMENTS

| CN | 2214038 Y | 11/1995 |
|---|---|---|
| TW | 529570 A | 4/2003 |

* cited by examiner

*Primary Examiner*—Anita M. King
(74) *Attorney, Agent, or Firm*—Birch, Stewart, Kolasch & Birch, LLP

(57) ABSTRACT

A pedestal set for the vertical and horizontal oriented product includes a chassis, a cover element, and a magnetic element. The chassis has a concave portion and a first joint portion, which is disposed on a surface of the chassis opposite to the concave portion. The first joint portion is connected to an external apparatus. The cover element is disposed on the concave portion to form an accommodating space. The magnetic element is placed in the accommodating space.

17 Claims, 5 Drawing Sheets

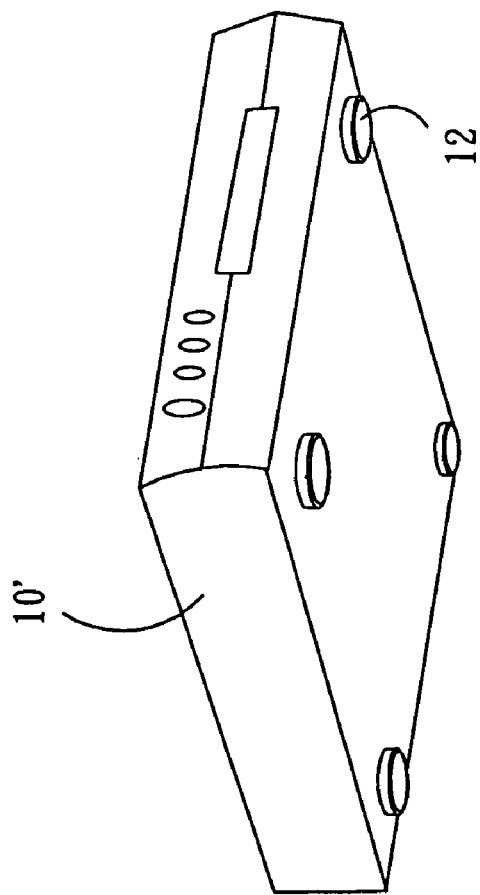
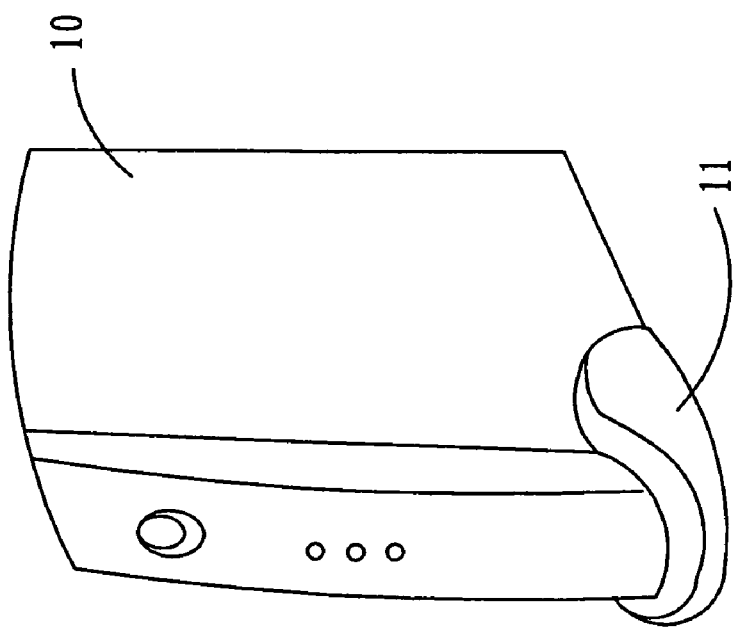
PRIOR ART
FIG. 1B
PRIOR ART
FIG. 1A

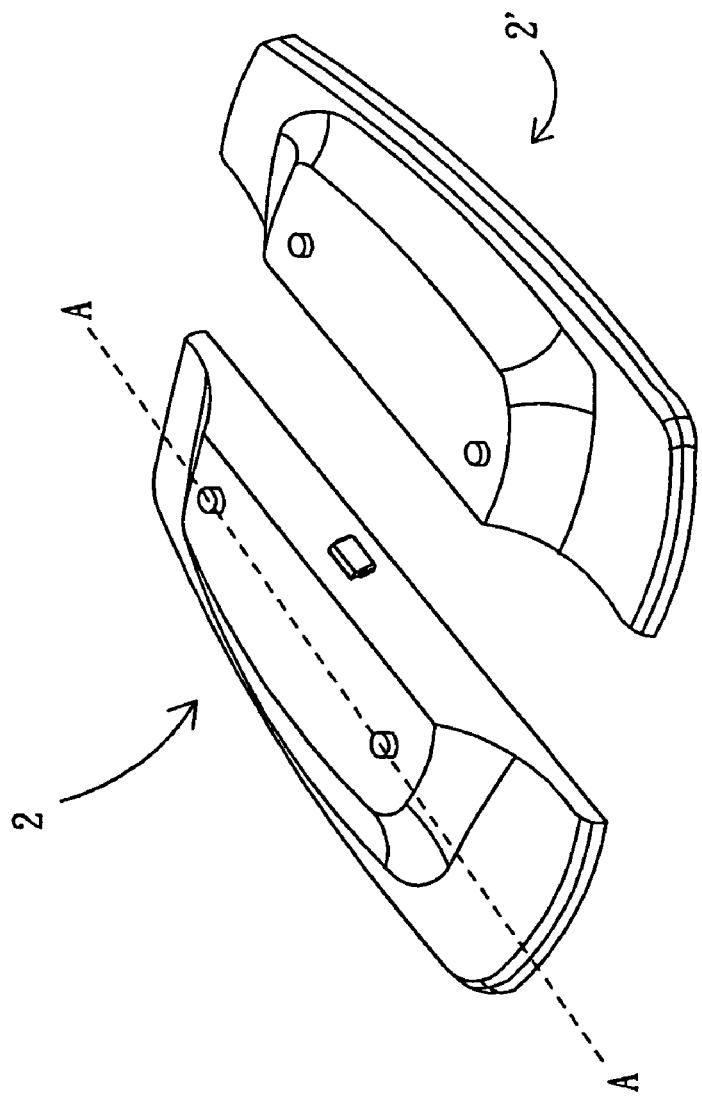
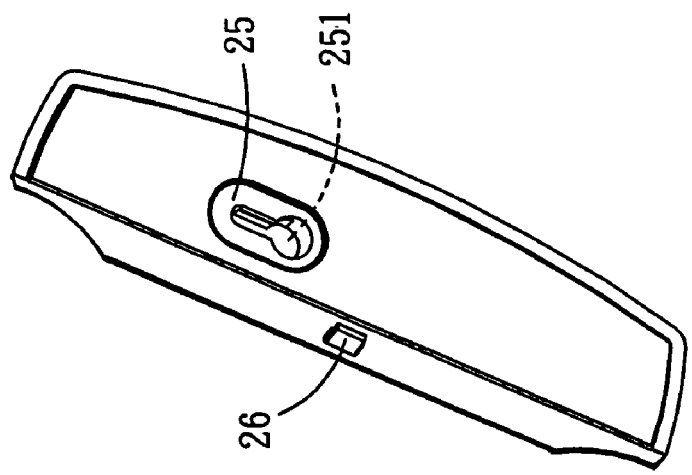
FIG. 3B
FIG. 3A

PEDESTAL SET

BACKGROUND OF THE INVENTION

1. Field of Invention

The invention relates to a pedestal set and, in particular, to a pedestal set suitable for horizontally and vertically oriented products.

2. Related Art

To avoid the direct impact of external forces on the contact surface of an electronic product, such as a desktop computer, the product is usually installed with an elastic pedestal set or pad made of rubber to absorb external forces. The current designs of the pedestal set or pad are for only one of the horizontally and vertically oriented electronic products. If the user wants to change the configuration of the electronic products to match the available space, the originally provided pedestal set or pad will not work any more.

As shown in FIG. 1A, a pedestal set 11 of a vertically oriented product 10 is fixed at the bottom of the product 10. If the product 10 is to be placed horizontally, the pedestal set 11 will not work. Therefore, the product 10 is limited by the space and cannot be put horizontally to flexibly match the available space. As shown in FIG. 1B, the pedestal set of the horizontally oriented electronic product 10' usually includes four pointed rubber pedestal pads 12 fixed at the bottom of the product 10'. Once the user wants to put the product 10' vertically, no corresponding pedestal set or pad can be used.

Moreover, the conventional pedestal set can be stabilized or fixed depending on the weight of the product. Therefore, it can only have an orientation downwardly, so that the electronic product is placed, for example, on a desktop. Accordingly, the electronic products cannot be placed with full freedom according to the given space. It is therefore an important subject to provide a pedestal set or a pad suitable for the vertically and horizontally oriented electronic products.

SUMMARY OF THE INVENTION

In view of the foregoing, the invention provides a pedestal set suitable for vertically and horizontally oriented electronic products.

To achieve the above, a pedestal set of the invention includes a chassis, a cover element, and a magnetic element. The chassis has a concave portion and a first joint portion, which is disposed on a surface of the chassis opposite to the concave portion. The first joint portion is fixed with an external apparatus. The cover element is disposed on the concave portion to form an accommodating space. The magnetic element is placed in the accommodating space.

As previously mentioned, the pedestal set of the invention is suitable for the vertically and horizontally oriented products and uses the first joint portion to connect the pedestal set with the product. Therefore, as long as it has the corresponding joint portions, either the vertically or horizontally oriented products can be connected to the pedestal set.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein:

FIGS. 1A and 1B are schematic views of the pedestals in the prior art;

FIGS. 3A and 3B are schematic views of the pedestal set according to the preferred embodiment of the invention;

DETAILED DESCRIPTION OF THE INVENTION

Figure 2:
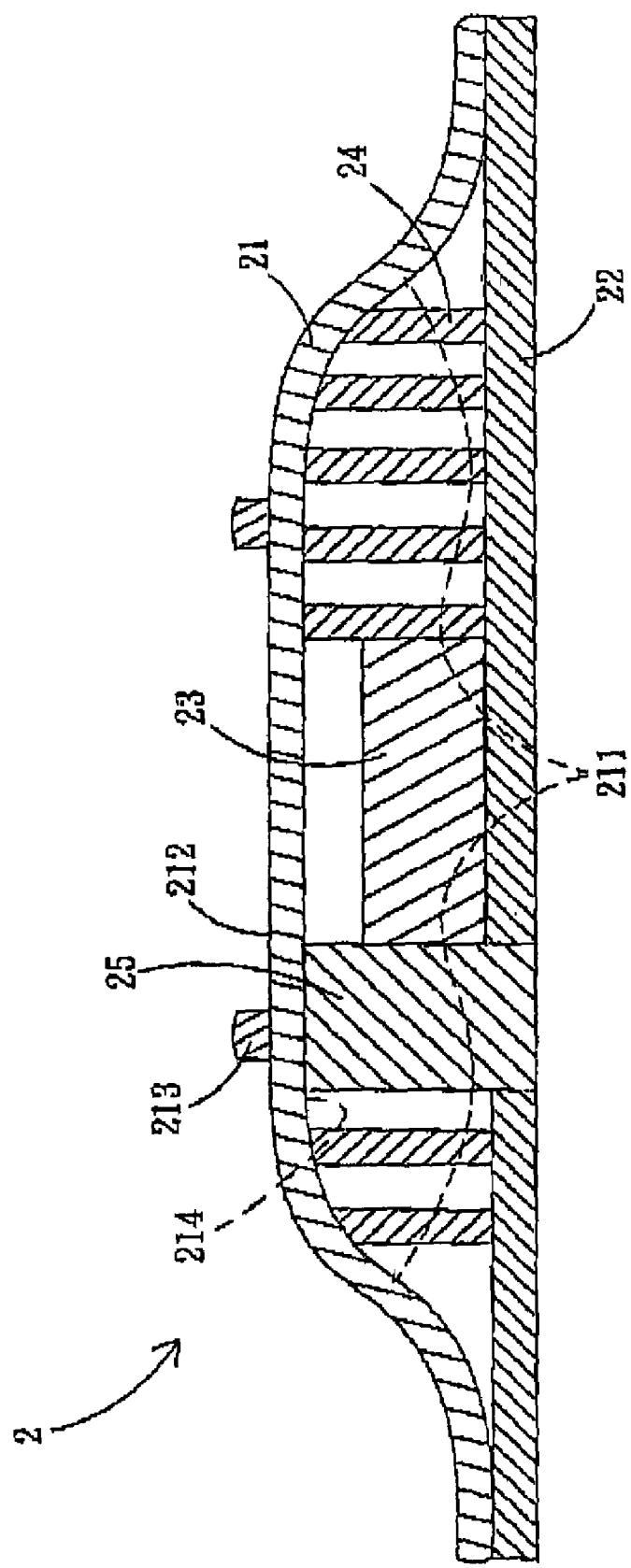
FIG. 2 is a cross-sectional view of a pedestal set according to a preferred embodiment of the invention along the line AA shown in FIG. 3B.

With reference to FIG. 2, a pedestal set 2 for the vertically and horizontally oriented products according to a preferred embodiment of the invention includes a chassis 21, a cover element 22, and a magnetic element 23. Considering the manufacturing processes, product designs, and costs, the pedestal set 2 of the embodiment further includes several supporting elements 24 and a bottom joint 25.

The chassis 21 has a concave portion 211 and at least a first joint portion 213. The first joint portion 213 is formed on a surface 212 of the chassis 21 opposite to the concave portion 211. The material of the chassis 21 can be plastic. Moreover, the chassis 21 can have a U shape, instead of the one shown in FIG. 2 with the tilted side extensions. In practice, the shape of the chassis 21 according to the preferred embodiment is preferably as that shown in FIG. 2. Considering the manufacturing processes and appearance designs, both sides of the chassis 21 is tilted and extended to cover the cover element 22 (to be explained in detail hereinafter). The first joint portion 213 is used to connect to the body of the suitable apparatus of the invention.

The cover element 22 is disposed on the concave portion 211 to form an accommodating space. The material of the cover element 22 is, for example, plastic, which provides friction to prevent the pedestal set 2 from skidding. It can also buffer the electronic product from external forces.

The magnetic element 23 is, for example, a magnet placed inside the accommodating space. The magnetic force of the magnetic element 23 penetrates through the cover element 22 to adhere to the surface of a magnetizable material (e.g. a metal or any hetero-magnetic material), such as an office partition.

Each of the supporting elements 24 extends from the bottom 214 of the concave portion 211 in the accommodating space to enhance the structural strength of the pedestal set 2. In this embodiment, each supporting element 24 is a rib made of, for example, plastic.

The bottom joint 25 extends from the bottom 214 of the concave portion 211 and is exposed to the cover element 22. The bottom joint 25 is used to connect the pedestal set 2 with a wall surface or any other surface. In this embodiment, the chassis 21, the supporting elements 24, and the bottom joint 25 can be integrally formed as a single body using the ejection-forming technology.

As shown in FIG. 3A, a surface of the bottom joint 25 is exposed to the cover element 22. The exposed surface of the bottom joint 25 has a connection portion 251 such as a concave hole for connecting with a hook or a protruding block. However, the connection method is not limited to the previously mentioned structure. The exposed surface of the bottom joint 25 can also be an adhesive surface that can be fixed to any other appropriate surface. The connection method of this invention should not be restricted to the above mentioned case.

One surface of the chassis 21 can be further provided with a chassis joint 26 (as shown in FIG. 3A), so that the surfaces of two pedestal sets 2 can be joined. For example, the two chassis 21 can have respectively a male chassis joint and a female chassis joint as shown in FIG. 3B. In this embodiment, the chassis joints 26, which are a male chassis joint and a female chassis joint, of two pedestal sets 2 and 2' are coupled to each other. However, the two pedestal sets 2, 2' can be coupled using other methods, such as an adhesive method. The connection method for the pedestal sets of this invention should not be restricted to the above mentioned case.

Figure 4:
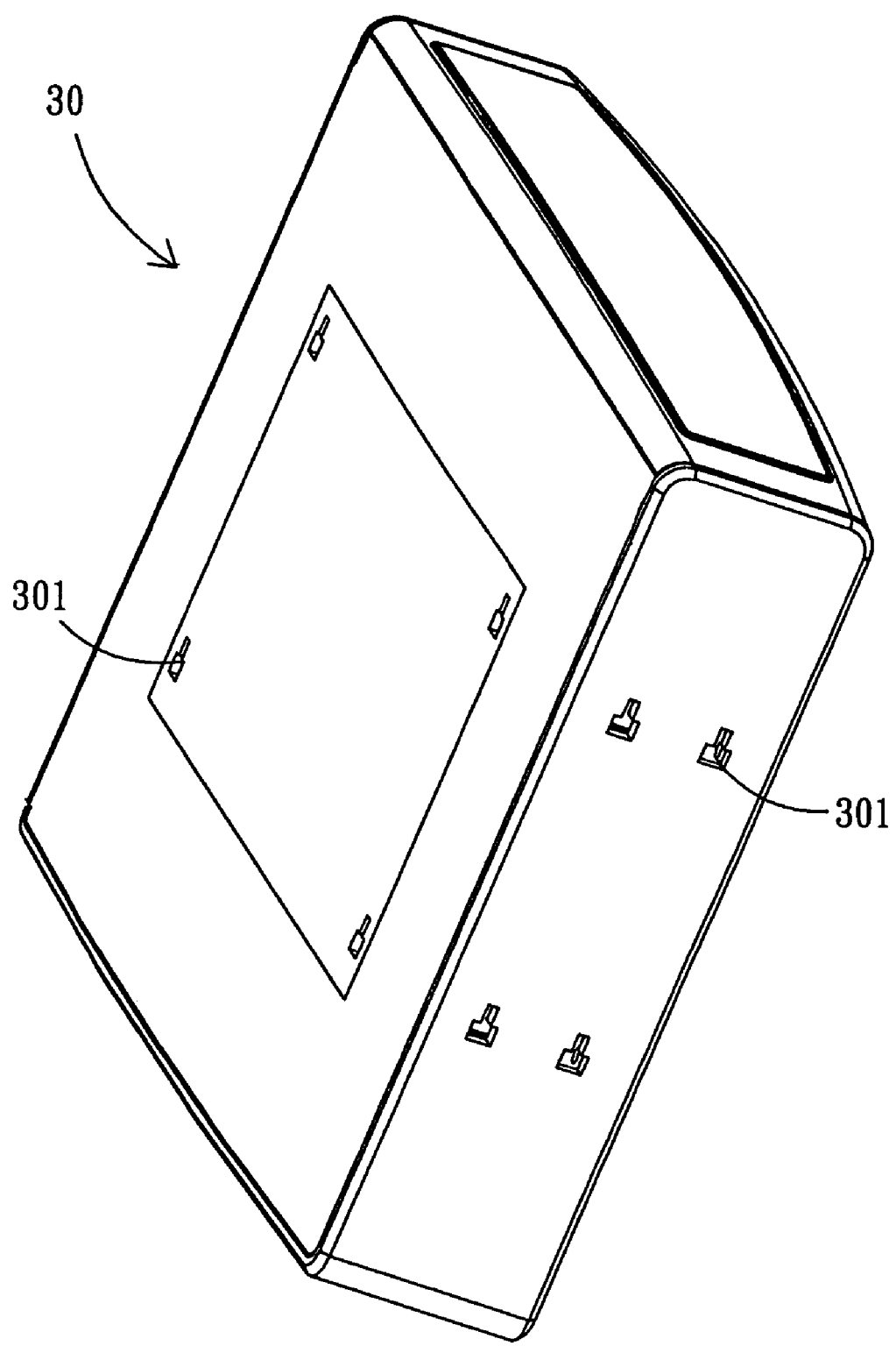
FIG. 4 is a schematic view of an apparatus body according to the preferred embodiment of the invention.

With reference to FIG. 4, an application of the pedestal set of the invention will be described. An apparatus body 30, such as a desktop computer or a modem, has a surface or surfaces with the second joint portions 301. The second joint portions 301 can be installed on the bottom surface and the side surface of the apparatus body 30. The second joint portion 301 is jointed with the first joint portion 213 of the pedestal set 2 described above to form an apparatus with a pedestal set. In this case, the second joint portions 301 can be several holes. The first joint portions 213 shown in FIG. 2 are several protruding structures. Therefore, the first joint portion 213 and the second joint portion 301 can be joined together.

Figure 5B:
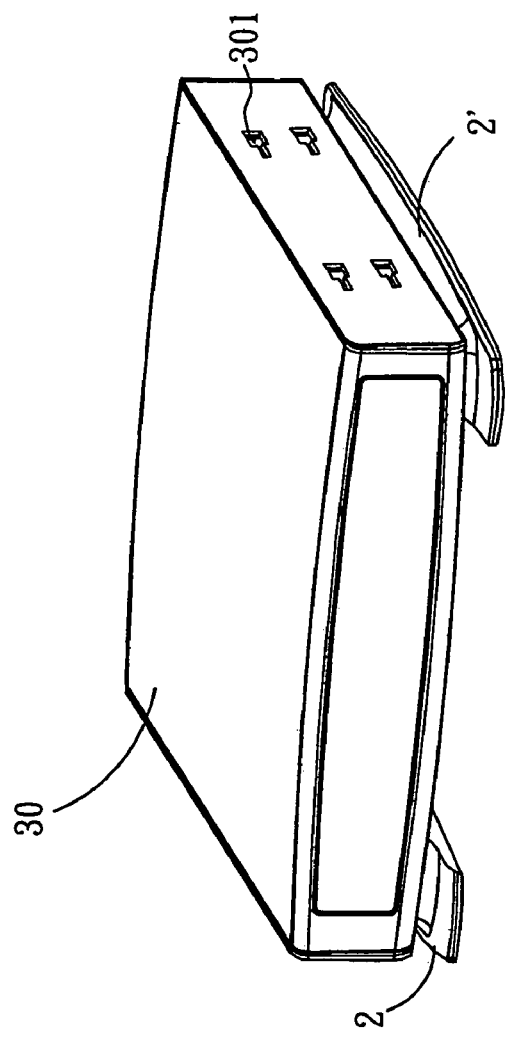
FIGS. 5A and 5B are schematic views of an apparatus with the pedestal set according to the preferred embodiment of the invention.
Figure 5A:
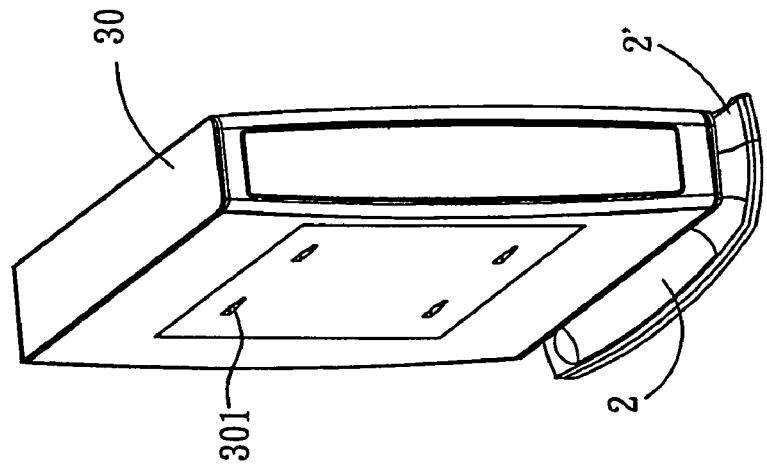

FIGS. 5A and 5B show respectively the apparatus with the pedestal set in its vertical and horizontal orientations. In this embodiments, the two pedestal sets 2, 2' are used as the pads of the apparatus body 30. When the apparatus body 30 is positioned horizontally, the two pedestal sets 2 and 2' are combined with the corresponding chassis joints 26, and then the first joint portions 213 of the two pedestal sets 2 and 2' are coupled with the second joint portions 301 of the apparatus body 30. Alternatively, when the apparatus body 30 is positioned vertically, the first joint portions 213 of the two pedestal sets 2 and 2' are respectively coupled with the second joint portions 301 of the apparatus body 30.

In summary, the pedestal set of the invention can be connected to products according to user's preferences. As long as there is a corresponding joint portion, the product can be jointed with the pedestal set in either vertically orientation or horizontally orientation. Moreover, the pedestal set is installed with a magnetic element. Therefore, the apparatus with such a pedestal set can adhere to the surface of a metal or a magnetizable material, such as office partitions. In addition, the bottom joint of the pedestal set can have a connecting concave hole for hanging on a wall surface. Therefore, the apparatus can further be disposed on surfaces other than the desktop, resulting in the more versatile space usage.

In comparison with the prior art that uses rubber pads as the pedestal pads, the invention has the following advantages:

1. The chassis of the invention is made of, for example, plastic. Based upon the cost consideration, its structure is designed to be hollow, and several supporting elements are provided to enhance the supporting strength. Therefore, the pedestal set of the invention has a better structural strength without increasing the cost.

2. The cover element of the invention is made of, for example, rubber, so that it can buffer the electronic product from external forces and be used to prevent skidding.

3. The magnetic element of the invention provides an additional adhesive method to adhere the product onto an office partition or a wall of an appropriate material.

4. The bottom joint of the invention provides another method of joint and fixture.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A pedestal set for a vertically and horizontally oriented apparatus, the pedestal set comprising:
    a chassis having a concave portion and a first joint portion located on a surface opposite to the concave portion to join with the apparatus;
    a cover element disposed on the concave portion to form an accommodating space;
    a magnetic element placed in the accommodating space; and
    a plurality of supporting elements extending from the bottom surface of the concave portion in the accommodating space.

2. The pedestal set of claim 1, wherein one surface of the chassis has a chassis joint.

3. The pedestal set of claim 2, wherein the chassis joint is a male chassis joint.

4. The pedestal set of claim 2, wherein the chassis joint is a female chassis joint.

5. The pedestal set of claim 1, wherein the supporting elements include a plastic rib.

6. The pedestal set of claim 1, wherein the chassis and the supporting elements are integrally formed.

7. The pedestal set of claim 1, wherein the cover element is a rubber pad.

8. The pedestal set of claim 1, further comprising a bottom joint extending from the bottom surface of the concave portion, wherein one surface of the bottom joint is exposed to the cover element.

9. The pedestal set of claim 8, wherein the exposed surface of the bottom joint has a connection portion.

10. The pedestal set of claim 1, wherein the chassis is made of plastic.

11. An apparatus, comprising:
    a pedestal set and an apparatus body,
    wherein the pedestal set has:
    a chassis with a concave portion and a first joint portion located on a surface opposite to the concave portion,
    a cover element disposed on the concave portion to form an accommodating space, a magnetic element placed in the accommodating space, and
    a plurality of supporting elements extending from the bottom surface of the concave portion in the accommodating space; and
    wherein one surface of the apparatus body has at least a second joint portion to be connected to the first joint portion.

12. The apparatus of claim 11, wherein one surface of the chassis has a chassis joint.

13. The apparatus of claim 11, wherein the supporting elements include a plastic rib.

14. The apparatus of claim 11, wherein the chassis and the supporting elements are integrally formed.

15. The apparatus of claim 11, wherein the cover element is a rubber pad.

16. The apparatus of claim 11, further comprising a bottom joint extending from the bottom surface of the concave portion, wherein one surface of the bottom joint is exposed to the cover element.

17. The apparatus of claim 11, wherein the chassis is made of plastic.

* * * * *